US011641767B2

(12) United States Patent
Chae et al.

(10) Patent No.: US 11,641,767 B2
(45) Date of Patent: May 2, 2023

(54) DISPLAY DEVICE

(71) Applicant: Samsung Display Co., LTD., Yongin-si (KR)

(72) Inventors: Jong Won Chae, Anyang-si (KR); Moo Soon Ko, Seoul (KR); Jin Seock Ma, Hwaseong-si (KR); Sung Hoon Moon, Cheonan-si (KR); Se Wan Son, Yongin-si (KR); Yong-Je Jeon, Yongin-si (KR); Jin Goo Jung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 204 days.

(21) Appl. No.: 17/139,485

(22) Filed: Dec. 31, 2020

(65) Prior Publication Data

US 2021/0280658 A1     Sep. 9, 2021

(30) Foreign Application Priority Data

Mar. 6, 2020     (KR) ........................ 10-2020-0028435

(51) Int. Cl.
*H01L 27/32*     (2006.01)

(52) U.S. Cl.
CPC ...... *H01L 27/3272* (2013.01); *H01L 27/3234* (2013.01); *H01L 27/3276* (2013.01)

(58) Field of Classification Search
CPC ............. H01L 27/3272; H01L 27/3286; G02F 1/136209; G09G 3/3648
See application file for complete search history.

(56) References Cited

U.S. PATENT DOCUMENTS

| | | | |
|---|---|---|---|
| 2005/0219436 A1* | 10/2005 | Kwon | ............... G02F 1/136209 349/44 |
| 2018/0046837 A1 | 2/2018 | Gozzini et al. | |
| 2018/0190944 A1* | 7/2018 | Lee | ..................... H01L 27/3272 |
| 2019/0165065 A1* | 5/2019 | Kong | .................. H01L 27/3272 |

FOREIGN PATENT DOCUMENTS

| | | |
|---|---|---|
| KR | 101859525 B1 | 6/2018 |
| KR | 1020190028245 A | 3/2019 |
| KR | 10-2020-0135637 A | 12/2020 |

* cited by examiner

*Primary Examiner* — Kevin M Nguyen
(74) *Attorney, Agent, or Firm* — Cantor Colburn LLP

(57) ABSTRACT

A display device includes: a substrate comprising a first layer and a second layer; a first display area including a first pixel area on the substrate; a second display area including a second pixel area and a transparent area adjacent to each other on the substrate; and a blocking layer disposed in the second pixel area of the second display area, and disposed between a first layer and a second layer of the substrate in a side view, and the blocking layer including a metal blocks light.

20 Claims, 9 Drawing Sheets

DISPLAY DEVICE

This application claims priority to Korean Patent Application No. 10-2020-0028435, filed on Mar. 6, 2020, and all the benefits accruing therefrom under 35 U.S.C. 119, the content of which in its entirety is incorporated by reference.

BACKGROUND

(a) Field

The disclosure relates to a display device.

(b) Description of the Related Art

A display device may include an optical device such as a sensor and a camera. The optical device may be disposed in a bezel area of the display device (the area surrounding a screen) to avoid interference with the screen.

When the bezel of the display device is reduced in size, a screen-to-body ratio of the display device, that is, a ratio of a screen to the display device when the display device is viewed from a front view, may be increased. Recently, a display device with increased screen-to-body ratio has been desired in the market. However, as it may be difficult to dispose the optical device in the bezel area when the bezel of the display device is reduced, development of technology for disposing the optical device in a screen area is desired.

SUMMARY

As described above, when disposing the optical device in the screen area, it is desired to prevent external light from flowing into the pixels disposed around the optical device to increase the display quality of the pixels disposed around the optical device. If a dummy metal layer is disposed around the pixels for displaying the image to prevent external light from flowing into the pixels, static electricity may flow in through the dummy metal layer or may generate undesired parasitic capacitance with the signal line in the pixel.

Embodiments related to a display device in which the optical device is disposed in a screen area, external light is effectively prevented from entering the pixels disposed around the optical device, and static electricity is effectively prevented from flowing around the optical device such that display quality deterioration due to undesired parasitic capacitance is effectively prevented.

According to an embodiment of the invention, a display device includes: a substrate comprising a first layer and a second layer; a first display area including a first pixel area on the substrate; a second display area including a second pixel area and a transparent area adjacent to each other on the substrate; and a blocking layer disposed in the second pixel area of the second display area, and disposed between a first layer and a second layer of the substrate in a side view, and the blocking layer including a metal blocks light.

In an embodiment, the substrate may further include a barrier layer disposed between the first layer and the second layer. In such an embodiment, the first layer, the second layer and the barrier layer may be disposed in the first display area and the second display area, and the blocking layer may not be disposed in the transparent area of the second display area.

In an embodiment, the display device may further include an optical device overlapping the second display area. In such an embodiment, the optical device may be disposed under the second layer in a side view.

In an embodiment, the blocking layer may have a thickness of about 100 angstroms (Å) or less.

In an embodiment, the second display area may further include a wiring area disposed at an edge of the transparent area, and the blocking layer may be disposed in the wiring area.

In an embodiment, the blocking layer may be disposed between the barrier layer and the second layer.

In an embodiment, the second layer may not be disposed in the transparent area.

In an embodiment, the blocking layer may be disposed between the first layer and the barrier layer.

In an embodiment, a pixel density of the second display area may be smaller than a pixel density of the first display area.

In an embodiment, each of the first pixel area and the second pixel area may include a pixel, and the pixel may include an organic light emitting element.

In an embodiment, the first pixel area and the second pixel area may include a plurality of insulating layers disposed on the substrate, and the plurality of insulating layers may not be disposed in the transparent area.

According to an embodiment of the invention, a display device includes: a substrate including a first layer and a second layer overlapping each other, and a blocking layer disposed between the first layer and the second layer. In such an embodiment, a first display area and a second display area are defined on the substrate, a plurality of first pixel areas is defined on the substrate in the first display area, a plurality of second pixel areas is defined on the substrate in the second display area, and a transparent area adjacent to the plurality of second pixel areas is defined on the substrate in the second display area. In such an embodiment, the blocking layer overlaps the plurality of second pixel areas, does not overlap the transparent area, and blocks light.

In an embodiment, a peeling force between the first layer and the second layer of the substrate may be greater than about 90 gram-force per inch (gf/inch).

According to embodiments of the display device including the optical device, by disposing the optical device within a screen, the display area may be widened, external light may be prevented from being incident to the pixels disposed around the optical device, and static electricity inflowing around the optical device or the display quality deterioration caused by undesired parasitic capacitance may be effectively prevented.

DETAILED DESCRIPTION

Figure 1:
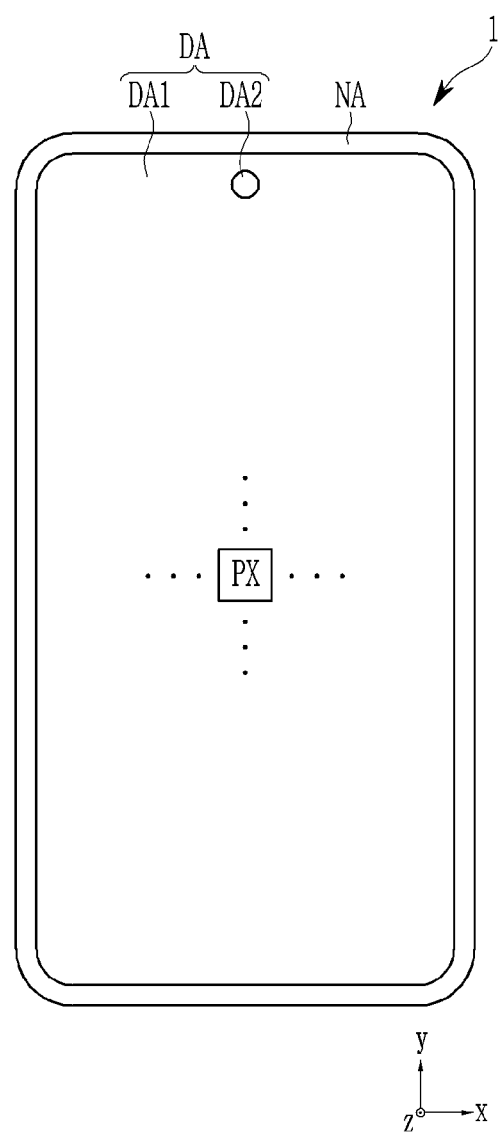
FIG. 1 is a schematic top plan view of a display device according to an embodiment.

The invention will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In the drawings, as symbols used for indicating directions, 'x' is a first direction, 'y' is a second direction perpendicular to the first direction, and 'z' is a third direction perpendicular to the first direction and the second direction. Further, throughout the specification, the phrase "on a plane" means viewing a target from a front plan view in the third direction z, and the phrase "on a cross-section" means viewing a cross-section formed by vertically cutting a target from a side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings. For convenience of description, embodiments where a display device is an emissive display device will hereinafter be described in detail, but the invention is not limited thereto.

Figure 2:
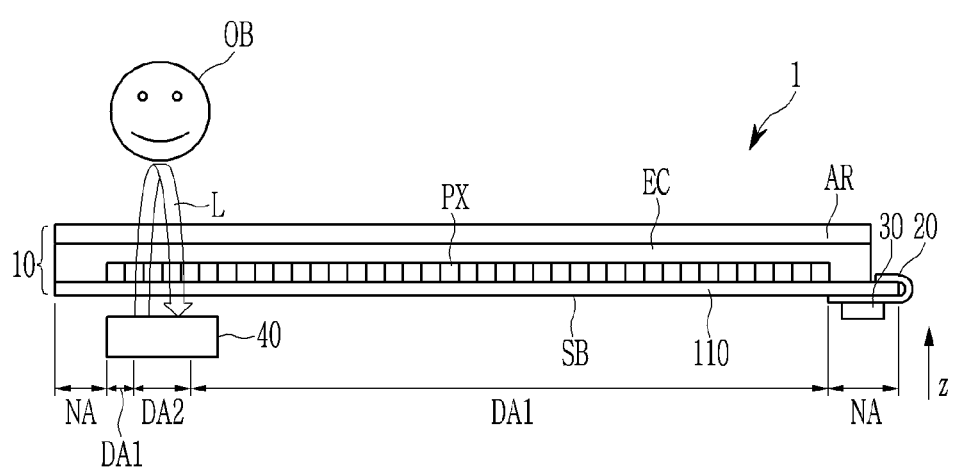
FIG. 2 is a schematic cross-sectional view of a display device according to an embodiment.

FIG. 1 is a schematic top plan view of a display device according to an embodiment, and FIG. 2 is a schematic cross-sectional view of a display device according to an embodiment.

Referring to FIG. 1 and FIG. 2, an embodiment of a display device 1 may include a display panel 10, a flexible printed circuit film 20 connected to the display panel 10, a driving unit including an integrated circuit chip 30 and the like, and an optical device 40.

The display panel 10 may include a display area DA, in which an image is displayed, and a non-display area NA that is disposed to surround the display area DA and does not display an image. The display area DA may correspond to a screen.

A plurality of pixels PX are disposed in the display area DA. Here, a pixel PX is a minimum unit that displays the image, and each pixel PX may display a specific color, for example, one color among red, green and blue, based on an input image signal, with various luminances.

In the non-display area NA, circuits and/or signal lines for generating and/or transmitting various signals applied to the display area DA are disposed. Signal lines such as a gate line, a data line, a driving voltage line, and the like are connected to a corresponding pixel PX, and each pixel PX may receive a gate signal, a data voltage, a driving voltage, and the like from such signal lines.

The display area DA includes a first display area DA1 and a second display area DA2. The second display area DA2 has higher transmittance than the first display area DA1 for functions other than a function of displaying an image. Here, transmittance means transmittance of light passing through the display panel 10 in a third direction z. The light may be light having a wavelength other than visible light, and/or visible light, for example, infrared light. The second display area DA2 has a smaller density of the pixels PX than the first display area DA1. Here, a density of the pixels PX means the number of the pixels PX per unit area.

In the display area DA, the second display area DA2 may be disposed in various ways. In an embodiment, as shown in FIG. 1, the second display area DA2 is disposed within the first display area DA1 and is surrounded by the first display area DA1.

The second display area DA2 may be disposed adjacent to or in contact with the non-display area NA. The second display area DA2 may be disposed at the left, right, and/or center in the upper side portion of the display area DA. The second display area DA2 may be divided into two or more areas. The second display area DA2 may be disposed completely across the upper side portion of the display area DA along the first direction x. The second display area DA2 may be disposed along the second direction y across a left side portion and/or a right side portion of the display area DA. The second display area DA2 may have various shapes such as a quadrangle, a triangle, a polygon, a circle, and an oval, on a plane.

In an embodiment, a driving unit that generates and/or processes various signals for driving the display panel 10 may be disposed in the non-display area NA of the display panel 10. The driving unit may include a data driver for applying a data voltage to the data lines, a gate driver for applying a gate signal to the gate lines, and a signal controller for controlling the data driver and the gate driver.

The driving unit may be integrated on the display panel 10, and may be disposed on opposing sides or a single side of the display area DA. The data driver and the signal controller may be provided as an integrated circuit ("IC") chip (also referred to as a driving IC chip) 30, and the IC chip 30 may be mounted on a flexible printed circuit film 20 and electrically connected to the display panel 10. The IC chip 30 may be mounted on the non-display area NA of the display panel 10.

In an embodiment, the display panel 10 may include a substrate SB, and a plurality of pixels PX may be disposed on the substrate SB. The substrate SB may be disposed continuously across the first display area DA1 and the second display area DA2.

In an embodiment, the display panel 10 may include an encapsulation layer EC covering or encapsulating the pixels PX. The encapsulation layer EC seals the first display area DA1 and the second display area DA2 to prevent moisture or oxygen from entering the display panel 10. In an alternative embodiment, where the encapsulation layer EC has a same form as the substrate, the substrate SB and the encapsulation layer EC may be bonded by a sealing member. An anti-reflection layer AR for reducing reflection of external light may be disposed on the encapsulation layer EC, and the anti-reflection layer AR may include a polarization layer and/or a phase delay layer.

An optical device 40 may be disposed below or on a rear side of the display panel 10. The optical device 40 may be a sensor, a camera, a flash, or the like. In an embodiment, where the optical device 40 is a sensor, the optical device 40 may be a proximity sensor or an illuminance sensor. Light at the wavelength used by the optical device 40 may pass through the display panel 10 with higher transmittance through the second display area DA2. In an embodiment, other various electronic devices may be further disposed on the rear side of the display panel 10 in addition to the optical device 40.

The optical device 40 may emit light L in a predetermined wavelength range toward an object OB disposed in front of the display panel 10, or may receive light L reflected from the object OB. The light L in this predetermined wavelength range is light having a wavelength that may be processed in the optical device 40, and may be visible light and/or infrared light. Light of a certain wavelength may mainly pass through the transparent area disposed in the second display area DA2. In an embodiment, where the optical device 40 uses infrared light, light of a certain wavelength may be in a wavelength range of about 900 nanometers (nm) to about 1000 nm. The optical device 40 may receive light of a certain wavelength radiated on the front surface of the display panel 10. The optical device 40 may be disposed corresponding to the entire second display area DA2, or may be disposed corresponding to only a portion of the second display area DA2. In an embodiment, a plurality of optical devices 40 may be disposed in the second display area DA2.

The first display area DA1 and the second display area DA2 of the display device 1 according to an embodiment will hereinafter be described in greater detail with reference to FIG. 3 along with FIG. 1 and FIG. 2.

Figure 3:
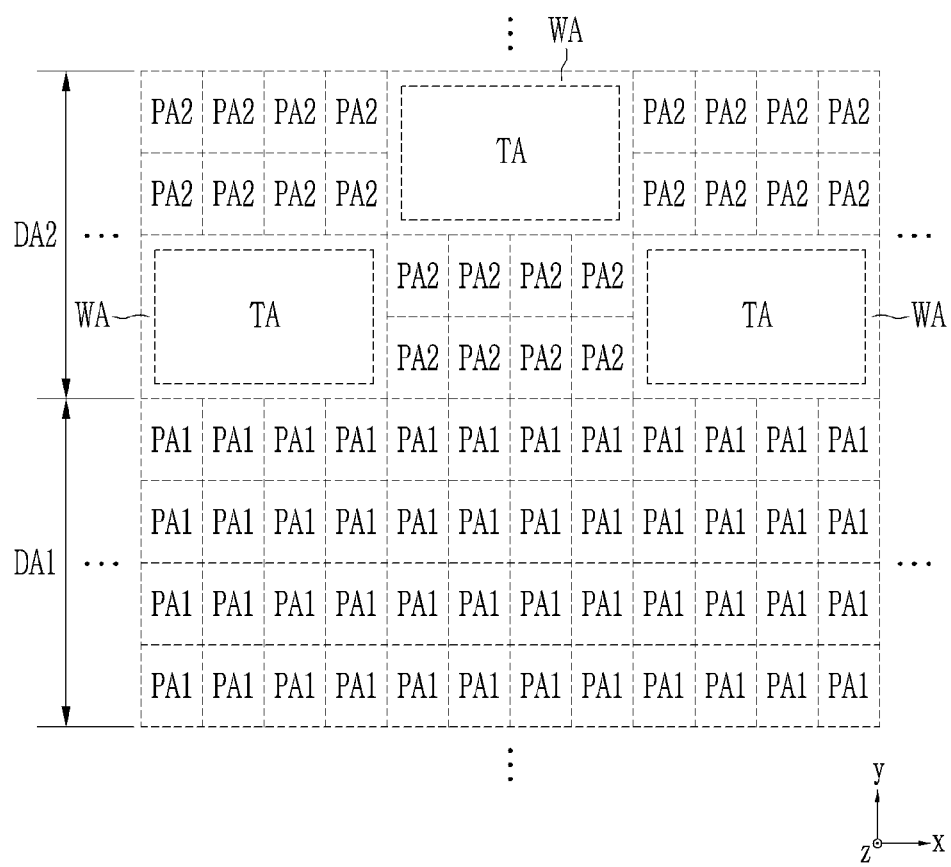
FIG. 3 is a schematic plan view of a part of a first display area and a second display area of a display device according to an embodiment.

FIG. 3 is a schematic plan view of the part of the first display area DA1 and the second display area DA2 of the display device 1 according to an embodiment.

Referring to FIG. 3, in an embodiment of the display device 1, the first display area DA1 includes a plurality of first pixel areas PA1, and the second display area DA2 includes a plurality of second pixel areas PA2, a plurality of transparent areas TA, and a plurality of wiring areas WA disposed between the plurality of second pixel areas PA2 and the plurality of transparent areas TA. The plurality of wiring areas WA is respectively disposed to surround the plurality of transparent areas TA.

The size of one first pixel area PA1 and the size of one second pixel area PA2 may be the same as or different from each other.

In the first display area DA1, the first pixel areas PA1 may be arranged in a matrix form in the first direction x and the second direction y, which are different directions.

In the second display area DA2, the second pixel areas PA2 and the transparent areas TA may be arranged in a matrix form. The second pixel areas PA2 and the transparent areas TA may be arranged in a checkerboard pattern so that the second pixel areas PA2 and the transparent areas TA may be evenly mixed or uniformly arranged. That is, the transparent areas TA may be adjacent around one second pixel area PA2 in the first direction x and the second direction y, and the second pixel areas PA2 may be adjacent around one transparent area TA in the first direction x and the second direction y. At least one second pixel area PA2 and at least one transparent area TA may be alternately arranged in the first direction x and/or the second direction y.

According to an embodiment, in the second display area DA2, an area ratio of one transparent area TA to one second pixel area PA2 may be about 8:1. In an embodiment, as shown in FIG. 3, eight second pixel areas PA2 may be disposed in the area corresponding to the transparent area TA, e.g. in an area between two adjacent transparent areas TA. However, the number of the second pixel areas PA2 disposed in an area corresponding to one transparent area TA may be variously modified.

According to an embodiment, in the second display area DA2, eight second pixel areas PA2 and one transparent area TA may be alternately disposed along the first direction x and the second direction y.

The size of each transparent area TA may be the same or different from each other. The arrangement and the size of the second pixel areas PA2 and the transparent areas TA may be variously modified.

Each pixel area PA1 and PA2 may include a pixel PX. The pixel PX may include a pixel circuit and a light emission unit. The pixel circuit as a circuit for driving a light emitting element such as a light emitting diode, and may include a transistor, a capacitor, and the like. The light emission unit is an area where light is emitted from the light emitting element.

Next, the arrangement of the second display area of the display device according to an alternative embodiment will be described with reference to FIG. 4.

Figure 4:
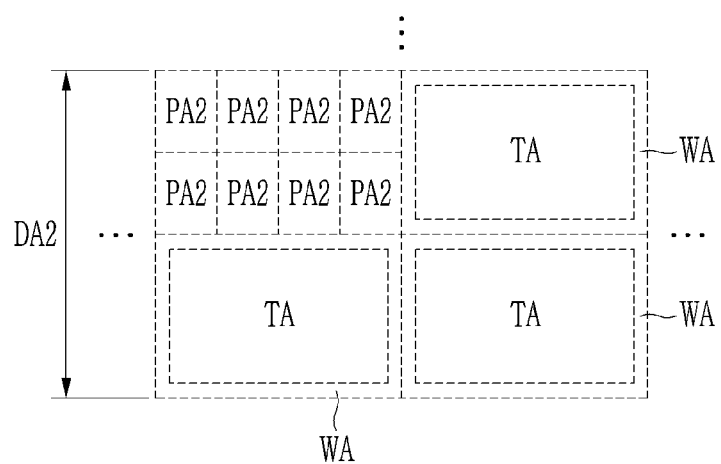
FIG. 4 is a schematic plan view of a part of a second display area of a display device according to an alternative embodiment.

FIG. 4 is a schematic plan view of a part of a second display area of a display device according to an alternative embodiment.

Referring to FIG. 4, in an embodiment, the second display area DA2 of the display device includes a plurality of second pixel areas PA2, a plurality of transparent areas TA, and a plurality of wiring areas WA disposed between the plurality of second pixel areas PA2 and the plurality of transparent areas TA.

According to an embodiment, in the second display area DA2, the area ratio of one transparent area TA to one second pixel area PA2 may be about 8:1. In an embodiment, as shown in FIG. 4, eight second pixel areas PA2 may be disposed in the area corresponding to one transparent area TA. However, the number of the second pixel areas PA2 disposed in the area corresponding to one transparent area TA is not limited thereto, but may be variously modified.

According to an embodiment, in the second display area DA2, the plurality of transparent areas TA may be disposed in the first direction x and the second direction y to surround the periphery of eight second pixel areas PA2.

In an embodiment, as shown in FIG. 3, the total area of the transparent areas TA in the second display area DA2 may be substantially the same as that of the second pixel areas PA2 in the second display area DA2. In an alternative embodiment, as shown in FIG. 4, the total area of the transparent areas TA in the second display area DA2 may be relatively large compared with that of the second pixel areas PA2 in the second display area DA2. Accordingly, the light transmission efficiency of light emitted from the optical device disposed in the second display area DA2 may be increased. However, the arrangement and size of the second pixel areas PA2 and the transparent areas TA is not limited thereto, but may be variously modified.

Next, the arrangement of the second display area of the display device according to another alternative embodiment will be described with reference to FIG. 5.

Figure 5:
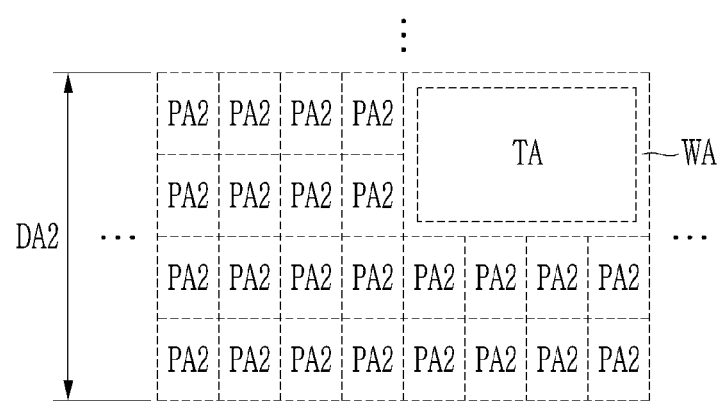
FIG. 5 is a schematic plan view of a part of a second display area of a display device according to another alternative embodiment.

FIG. 5 is a schematic plan view of a part of a second display area of a display device according to another alternative embodiment.

Referring to FIG. 5, in an embodiment, the second display area DA2 of the display device includes a plurality of second pixel areas PA2, a plurality of transparent areas TA, and a plurality of wiring areas WA disposed between the plurality of second pixel areas PA2 and the plurality of transparent areas TA.

According to an embodiment, in the second display area DA2, the area ratio of one transparent area TA to one second pixel area PA2 may be about 8:1. In such an embodiment, eight second pixel areas PA2 may be disposed in the area corresponding to one transparent area TA. However, the number of the second pixel areas PA2 disposed in an area corresponding to one transparent area TA is not limited thereto, but may be variously modified.

According to an embodiment, in the second display area DA2, eight second pixel areas PA2 may be disposed in the first direction x and the second direction y to surround the periphery of one transparent area TA.

In such an embodiment, as shown in FIG. 5, the total area of the second pixel areas PA2 in the second display area DA2 may be relatively large compared with the total area of the transparent areas TA in the second display area DA2. Accordingly, the display efficiency of the plurality of pixels disposed in the second display area DA2 is increased, and a more accurate image may be displayed. However, the arrangement and size of the second pixel areas PA2 and the transparent areas TA is not limited thereto, but may be variously modified.

The pixel area of the second display area and the arrangement of the transparent area of the display device according to the embodiments described with reference to FIG. 3 to FIG. 5 are merely exemplary, and the area and the arrangement of the pixel area and the transparent area may be variously modified.

Next, an interlayer structure of the second display area of the display device according to an embodiment will be described with reference to FIG. 6.

Figure 6:
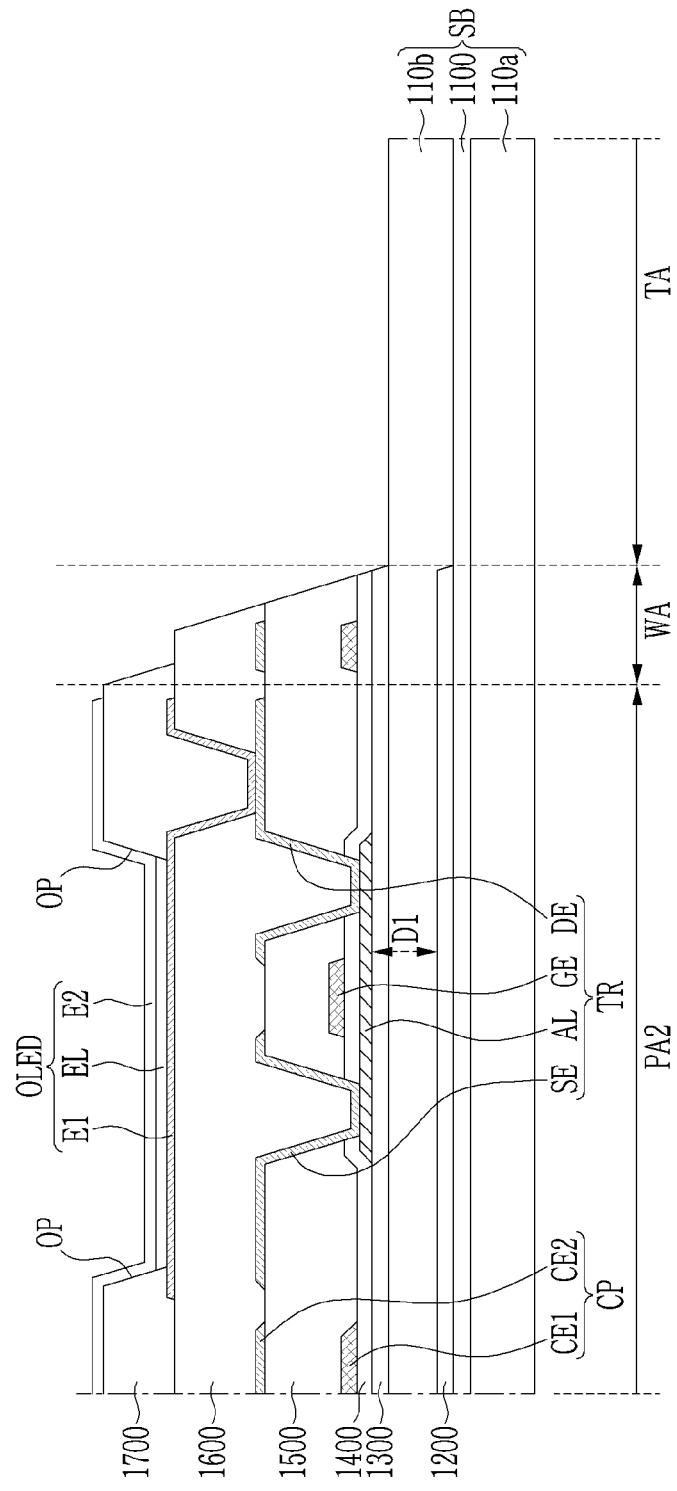
FIG. 6 is a cross-sectional view of a part of a second display area of a display device according to an embodiment.

FIG. 6 is a cross-sectional view of a part of a second display area of a display device according to an embodiment.

Referring to FIG. 6, an embodiment of the display device includes a substrate SB and several layers, wires, and elements formed thereon. The elements may include a transistor TR, a capacitor CP, and a light emitting diode OLED. In an embodiment, the light emitting diode may be an organic light emitting diode ("OLED").

The substrate SB may include a polymer such as a polyimide, a polyamide, or an insulating material such as glass, and may be optically transparent.

The substrate SB includes a first layer 110a and a second layer 110b overlapping each other, and a barrier layer 1100 and a blocking layer 1200 disposed between the first layer 110a and the second layer 110b.

The first layer 110a and the second layer 110b may include a polymer such as a polyimide, a polyamide, etc.

The barrier layer 1100 may prevent penetration of moisture, etc., and may include inorganic insulating materials such as a silicon oxide (SiOx) and a silicon nitride (SiNx).

The blocking layer 1200 is disposed between the first layer 110a of the substrate SB, corresponding to the second pixel area PA2 and the wiring area WA, and the second layer 110*b*. In such an embodiment, the blocking layer 1200 is disposed between the barrier layer 1100 of the substrate SB and the second layer 110*b*. The blocking layer 1200 includes a metal, prevents light inflowing from the outside from inflowing to the second pixel area PA2, and blocks light passing through the transparent area TA from diffracting around the transparent area TA.

The blocking layer 1200 is disposed at a position corresponding to the second pixel area PA2 to prevent light from flowing in from an outside, particularly to prevent light flowing from the rear side of the substrate SB from flowing to the transistor TR and the light emitting diode OLED disposed in the second pixel area PA2, thereby preventing quality deterioration of the transistor TR and the light emitting diode OLED due to the external light.

The blocking layer 1200 is also disposed in the wiring area WA disposed to surround the periphery of the transparent area TA to prevent light passing through the transparent area TA from diffracting around the transparent area TA, thereby preventing the optical device 40 from being deteriorated by the external light.

The blocking layer 1200 is removed from the transparent area TA, so that light may be effectively transmitted through the optical device 40. In such an embodiment, the blocking layer 1200 functions as a mask that allows laser light to transmit only to the transparent area TA when removing a layer such as the electrode disposed in the transparent area TA with a laser, thereby performing a laser process without using an additional mask while no damage occurs to the structure disposed in the second pixel area PA2.

The blocking layer 1200 may include a metal such as molybdenum (Mo), titanium (Ti), aluminum (Al), etc., and the thickness of the blocking layer 1200 may be about 100 angstroms (Å) or less. The blocking layer 1200 may increase adherence between the barrier layer 1100 and the second layer 110*b*.

In a conventional display device, the blocking layer 1200 is disposed on the substrate SB. However, according to an embodiment of the display device according to the invention, the blocking layer 1200 is disposed side the substrate SB in the plurality of second pixel areas PA2 of the second display area DA2 and the plurality of wiring areas WA, that is, the blocking layer 1200 is disposed between the first layer 110*a* and the second layer 110*b* of the substrate SB.

In an embodiment, as shown in FIG. 6, an interval D1 between the blocking layer 1200 and the transistor TR is greater than the interval between the upper or inner surface of the substrate SB and the transistor TR. In such an embodiment, the blocking layer 1200 of the display device is disposed between the first layer 110*a* and the second layer 110*b* of the substrate SB, thereby relatively increasing the interval between the blocking layer 1200 and the transistor TR (or between the blocking layer 1200 and the light emitting diode OLED), compared with a case where the blocking layer 1200 is disposed between the transistor TR and the substrate SB. Accordingly, the amount of undesired parasitic capacitance that may be formed between the blocking layer 1200 and the transistor TR (or between the blocking layer 1200 and the light emitting diode OLED), is reduced, and the influence of the parasitic capacitance is reduced. In such an embodiment, even if static electricity flows in through the blocking layer 1200 during the manufacturing process, the effect thereof on the transistor TR and the light emitting diode OLED becomes small or minimal.

In an embodiment, as shown in FIG. 6, a buffer layer 1300 may be disposed on the substrate SB in the second pixel area PA2 and the wiring area WA to prevent impurities from degrading the characteristics of the semiconductor layer AL from being diffused and the penetration of moisture.

A semiconductor layer AL of the transistor TR may be disposed on the buffer layer 1300. The semiconductor layer AL may include a channel area, and a source area and a drain area on opposing sides thereof. The semiconductor layer AL may include a semiconductor material such as polysilicon, amorphous silicon, or an oxide semiconductor.

A first insulating layer 1400 including an inorganic insulating material may be disposed on the semiconductor layer AL.

In an embodiment, a first conductor including the gate electrode GE of the transistor TR, the first electrode CE1 of the capacitor CP, and the gate line may be disposed on the first insulating layer 1400. The gate electrode GE may overlap the channel area of the semiconductor layer AL. The first conductor may include a metal such as molybdenum (Mo), copper (Cu), aluminum (Al), silver (Ag), chromium (Cr), tantalum (Ta), titanium (Ti), etc.

A second insulating layer 1500 including the inorganic insulating material or the organic insulating material may be disposed on the first conductor.

In an embodiment, a second conductor including the source electrode SE and the drain electrode DE of the transistor TR, the second electrode CE2 of the capacitor CP, the data line, and the driving voltage line may be disposed on the second insulating layer 1500. The source electrode SE and the drain electrode DE may be respectively connected to the source area and the drain area of the semiconductor layer AL through openings of the second insulating layer 1500. The second conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta).

The gate electrode GE, the source electrode SE, and the drain electrode DE collectively define or form the transistor TR along with the semiconductor layer AL. The first electrode CE1 and the second electrode CE2 collectively define or form the capacitor CP along with the insulating layer 1500 therebetween. The transistor TR and the capacitor CP of the pixel circuit may be disposed in the second pixel area PA2 and may not disposed in the transparent area TA.

A third insulating layer 1600 that may include the organic insulating material may be disposed between the second insulating layer 1500 and the second conductor. The third insulating layer 1600 may serve to planarize a step structure therebelow to increase the luminous efficiency of the light-emitting device thereon. The third insulating layer 1600 may cover the second insulating layer 1500 and the second conductor in the second pixel area PA2. The third insulating layer 1600 may cover the transistor TR.

The buffer layer 1300 and the first to third insulating layers 1400 to 1600 may be removed in the transparent area TA to improve the transmittance. In one embodiment, for example, The buffer layer 1300 and the first to third insulating layers 1400 to 1600 may be disposed between the transparent area TA and the second pixel area PA2, or may not be disposed in the transparent area TA except for the wiring area WA disposed to surround the edge of the transparent area TA.

The first electrode E1 of the light emitting diode OLED of the pixel PX may be disposed on the third insulating layer 1600.

The first electrode E1 may be disposed directly on the third insulating layer 1600 in the area corresponding to the light emission unit.

A fourth insulating layer 1700 including the organic insulating material may be disposed on the third insulating layer 1600 and the first electrode E1. An opening area OP may be defined through the fourth insulating layer 1700 to overlap the first electrode E1, and a light emission member EL may be disposed on the first electrode E1 disposed in the opening area OP. The light emission member EL may include a first organic common layer, an emission layer, and a second organic common layer that are sequentially stacked one on another. The first organic common layer may include at least one selected from a hole injection layer and a hole transferring layer. The emission layer may include a material layer that emits light of a primary color such as red, green, and blue. The emission layer may have a structure in which a plurality of material layers for emitting light of different colors are stacked. The second organic common layer may include at least one selected from an electron transferring layer and an electron injection layer.

A second electrode E2 may be disposed on the light emission member EL. The second electrode E2 may include a transparent conductive oxide ("TCO") such as indium tin oxide ("ITO") and indium zinc oxide ("IZO"), and may be a transparent electrode.

Although not shown in FIG. 6, at least one of signal lines may be disposed in the wiring area WA, and signal lines disposed in the wiring area WA may be provided for electrical connection between adjacent second pixel areas PA2.

Although not shown in FIG. 6, a capping layer may be disposed on the second electrode E2. The capping layer may increase the light efficiency by adjusting a refractive index. The capping layer may be disposed to cover the second electrode E2 as a whole. The capping layer may include the organic insulating material or the inorganic insulating material. An encapsulation layer may be disposed on the capping layer. The encapsulation layer may be a thin film encapsulation layer in which at least one inorganic layer and/or at least one organic layer is laminated on the capping layer, or may be an encapsulation substrate adhered to the substrate SB by an encapsulation member.

In the second pixel area PA2, the first electrode E1, the light emission member EL and the second electrode E2 collectively define or form the light-emitting element of the light emitting diode OLED. In an embodiment, the first electrode E1 may be an anode of a hole injection electrode, and the second electrode E2 may be a cathode of an electron injection electrode. Alternatively, the first electrode E1 may be the cathode and the second electrode E2 may be the anode.

In an embodiment, the elements of the pixel circuit such as the transistor TR and the capacitor CP that are disposed in the second pixel area PA2 are not disposed in the transparent area TA, thereby increasing the transmittance of the transparent area TA. In such an embodiment, as described above, the blocking layer 1200 disposed inside the substrate SB, and the buffer layer 1300 and the first insulating layer 1400 to the fourth insulating layer 1700 disposed on the substrate SB, are not disposed in the transparent area TA, thereby increasing the transmittance of the transparent area TA.

In an embodiment, the cross-sectional structure of the first pixel area PA1 of the first display area DA1 may correspond to the cross-sectional structure of the second pixel area PA2, but is not limited thereto.

Hereinafter, an alternative embodiment will be described.

Now, the interlayer structure of the second display area of the display device according to an alternative embodiment will be described with reference to FIG. 7

Figure 7:
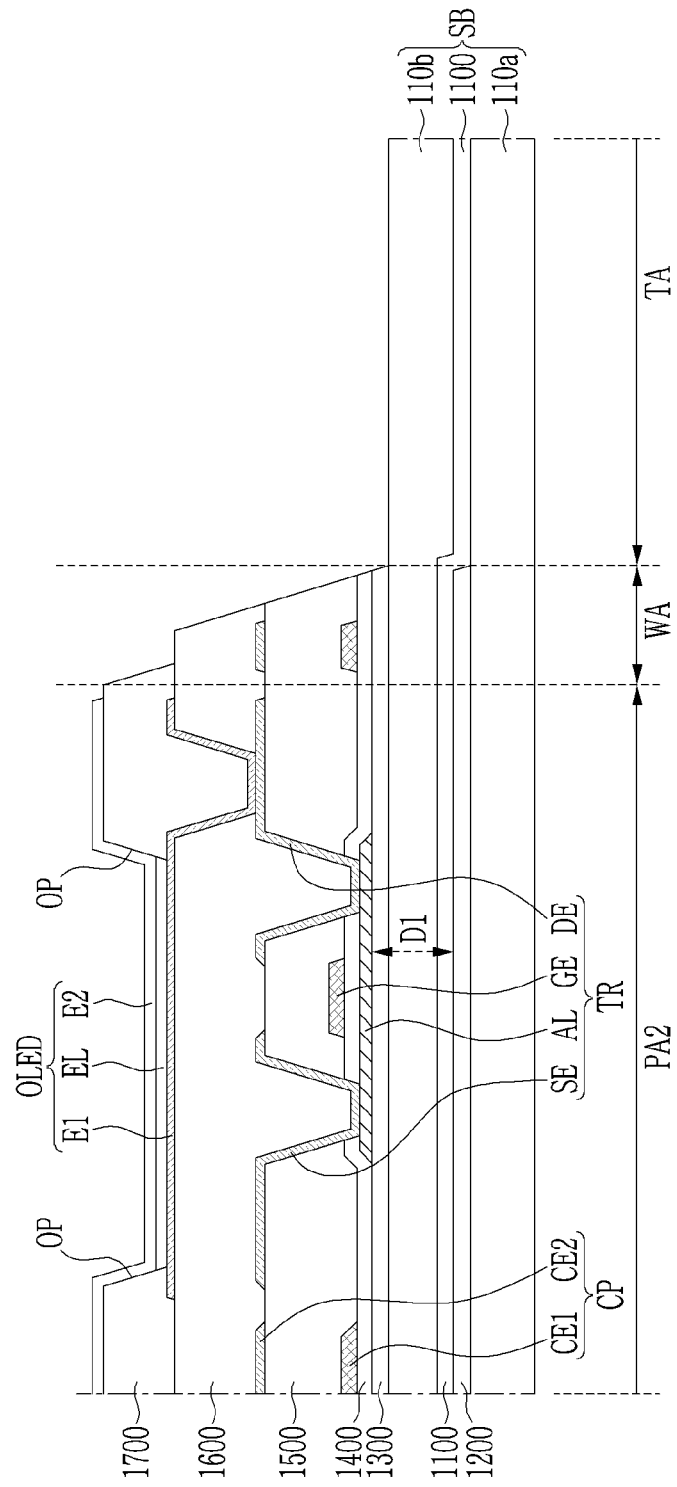
FIG. 7 is a cross-sectional view of a part of a second display area of a display device according to an alternative embodiment.

FIG. 7 is a cross-sectional view of a part of a second display area of a display device according to an alternative embodiment.

The interlayer structure of the second display area of the display device of FIG. 7 is substantially the same as that of the embodiments described above with reference to FIG. 6 except for the substrate SB.

In such an embodiment, as shown in FIG. 7, the substrate SB includes the first layer 110a and the second layer 110b, and the barrier layer 1100 and the blocking layer 1200 disposed between the first layer 110a and the second layer 110b.

The buffer layer 1300, the first insulating layer 1400 to the fourth insulating layer 1700, the transistor TR, the capacitor CP, and the light emitting diode OLED are disposed on the substrate SB corresponding to the second pixel area PA2.

In such an embodiment, the elements of the pixel circuit such as the transistor TR and the capacitor CP disposed in the second pixel area PA2 are not disposed in the transparent area TA, and the blocking layer 1200 disposed within the substrate SB, and the buffer layer 1300 and the first insulating layer 1400 to the fourth insulating layer 1700 disposed on the substrate SB, are not disposed.

Figure 9:
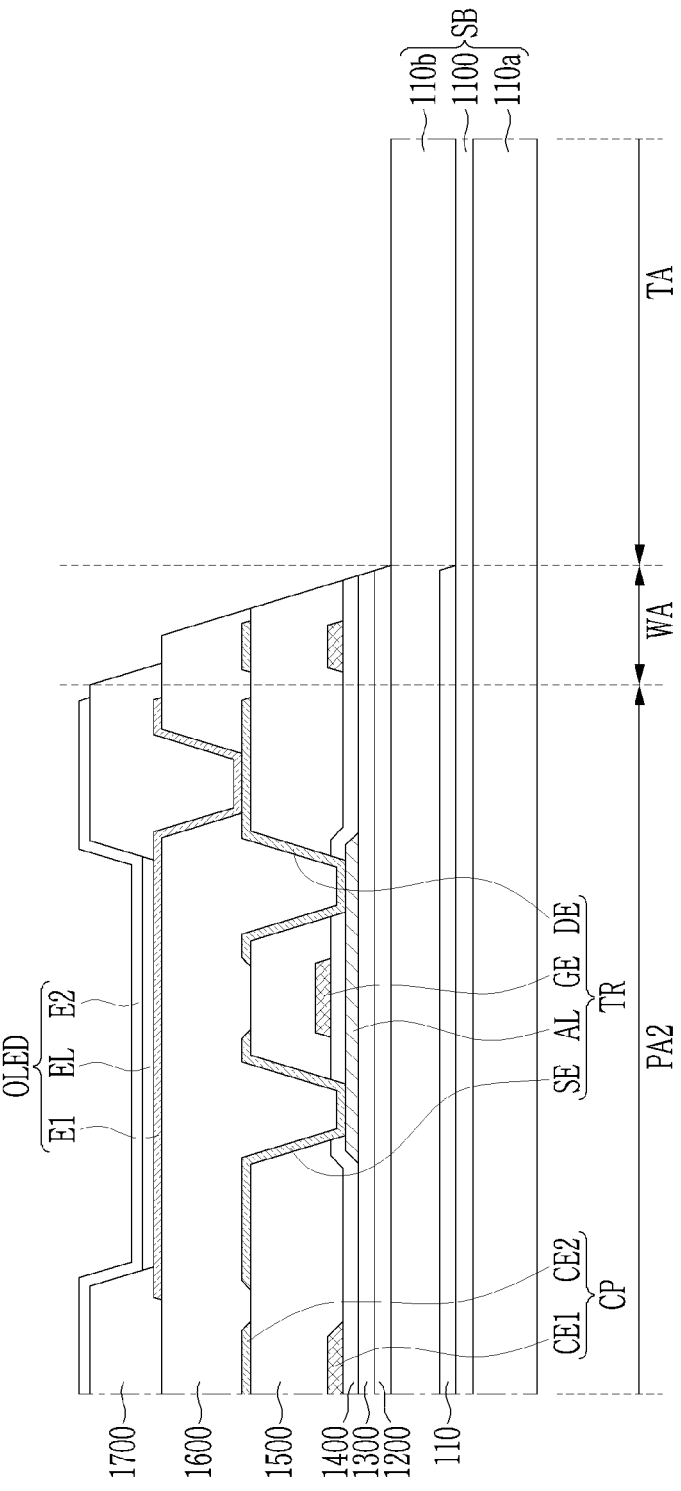
FIG. 9 is a cross-sectional view showing a second display area of a conventional display device.

In such an embodiment, as shown in FIG. 9, the blocking layer 1200 disposed in the second pixel area PA2 of the second display area and the wiring area WA may be disposed between the first layer 110a and the barrier layer 1100.

The blocking layer 1200 is disposed at the position corresponding to the second pixel area PA2 to prevent light inflowing from the outside, particularly, light inflowing from the rear side of the substrate SB from inflowing to the transistor TR and the light emitting diode OLED disposed in the second pixel area PA2, thereby preventing quality deterioration of the transistor TR and the light emitting diode OLED due to the external light.

The blocking layer 1200 is also disposed in the wiring area WA disposed to surround the periphery of the transparent area TA to prevent light passing through the transparent area TA from diffracting around the transparent area TA, thereby preventing the optical device 40 from being deteriorated by the external light.

The blocking layer 1200 is removed from the transparent area TA, so that light may be transmitted through the optical device 40.

In an embodiment, as shown in FIG. 7, the interval D1 between the blocking layer 1200 and the transistor TR is greater than the interval between the upper or inner surface of the substrate SB and the transistor TR. In such an embodiment, the blocking layer 1200 of the display device is disposed between the first layer 110a and the second layer 110b of the substrate SB, thereby relatively increasing the interval between the blocking layer 1200 and the transistor TR (or between the blocking layer 1200 and the light emitting diode OLED), compared with the case that the blocking layer 1200 is disposed between the transistor TR and the substrate SB. Accordingly, the amount of undesired parasitic capacitance that may be formed between the blocking layer 1200, and the transistor TR and the light emitting diode OLED, is reduced, and the influence of the parasitic capacitance is reduced. In such an embodiment, even if static electricity flows in through the blocking layer 1200 during the manufacturing process, the effect on the transistor TR and the light emitting diode OLED becomes small or minimal.

Now, the interlayer structure of the second display area of the display device according to another alternative embodiment will be described with reference to FIG. 8.

Figure 8:
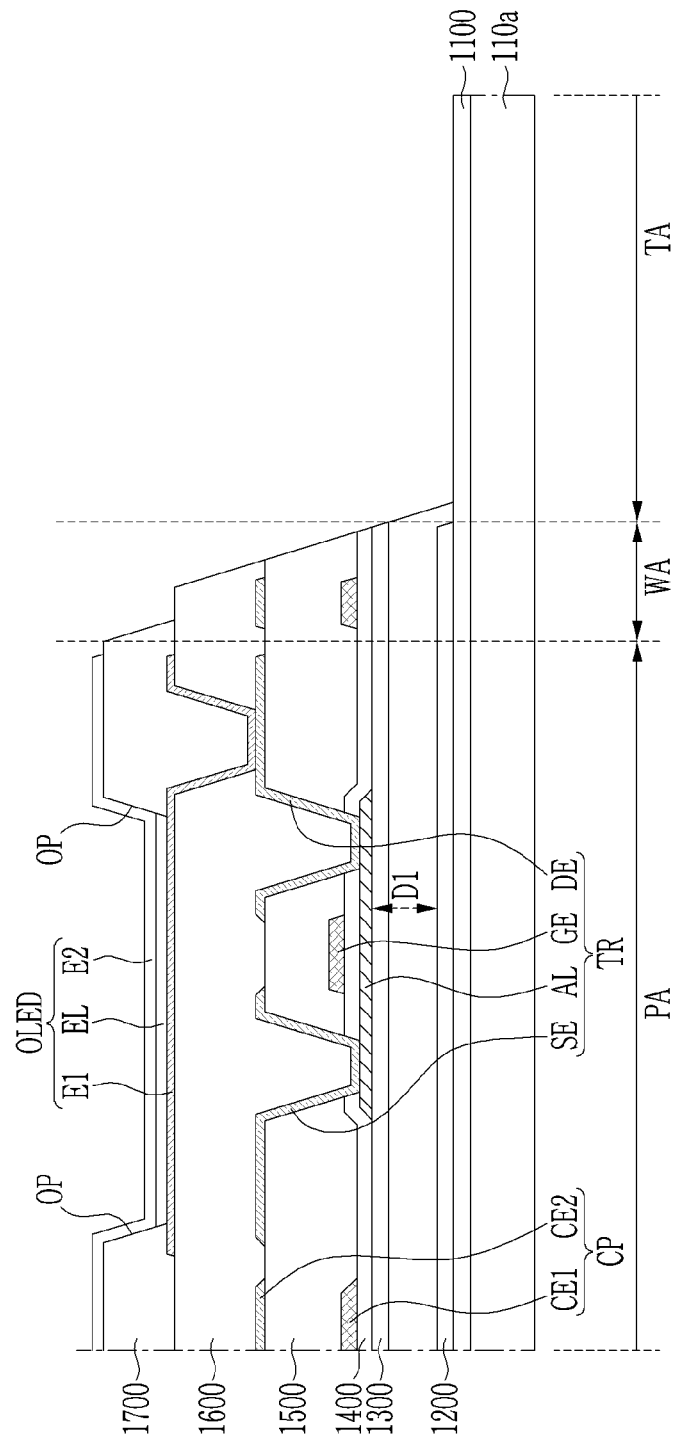
FIG. 8 is a cross-sectional view of a part of a second display area of a display device according to another alternative embodiment.

FIG. 8 is a cross-sectional view of a part of a second display area of a display device according to another alternative embodiment.

The interlayer structure of the second display area of the display device of FIG. 8 is substantially the same as that of the embodiments described above with reference to FIG. 6 except for the substrate.

In such an embodiment, the substrate SB includes the first layer 110*a* and the second layer 110*b*, and the barrier layer 1100 and the blocking layer 1200 disposed between the first layer 110*a* and the second layer 110*b*.

The buffer layer 1300, the first insulating layer 1400 to the fourth insulating layer 1700, the transistor TR, the capacitor CP, and the light emitting diode OLED are disposed on the substrate SB corresponding to the second pixel area PA2.

In an embodiment, the configurations of the pixel circuit such as the transistor TR and the capacitor CP disposed in the second pixel area PA2 are not disposed in the transparent area TA, and the blocking layer 1200 disposed within the substrate SB, and the buffer layer 1300 and the first insulating layer 1400 to the fourth insulating layer 1700 disposed on the substrate SB, are not disposed.

In such an embodiment, as shown in FIG. 8, the second layer 110*b* of the substrate SB is also removed in the transparent area TA. In such an embodiment, as described above, by removing the second layer 110*b* of the substrate SB of the transparent area TA, the transmittance of the transparent area TA may be further increased.

In an embodiment of the display device according to the invention, the blocking layer 1200 is disposed at the position corresponding to the second pixel area PA2 to prevent light inflowing from the outside, particularly light inflowing from the rear of the substrate SB from inflowing to the transistor TR and the light emitting diode OLED disposed in the second pixel area PA2, thereby preventing quality deterioration of the transistor TR and the light emitting diode OLED due to the external light.

The blocking layer 1200 is also disposed in the wiring area WA disposed to surround the periphery of the transparent area TA to prevent light passing through the transparent area TA from diffracting around the transparent area TA, thereby preventing the optical device 40 from being deteriorated by the external light.

In such an embodiment, the blocking layer 1200 is removed from the transparent area TA, so that light may be transmitted through the optical device 40.

In such an embodiment, as shown in FIG. 8, the interval D1 between the blocking layer 1200 and the transistor TR is greater than the interval between the upper or inner surface of the substrate SB and the transistor TR. In such an embodiment, the blocking layer 1200 of the display device is disposed between the first layer 110*a* and the second layer 110*b* of the substrate SB, thereby relatively increasing the interval between the blocking layer 1200 and the transistor TR (or between the blocking layer 1200 and the light emitting diode OLED), compared with the case that the blocking layer 1200 is disposed between the transistor TR and the substrate SB. Accordingly, the amount of undesired parasitic capacitance that may be formed between the blocking layer 1200 and the transistor TR (or between the blocking layer 1200 and the light emitting diode OLED) is reduced, and the influence of the parasitic capacitance is reduced. In such an embodiment, even if static electricity flows in through the blocking layer 1200 during the manufacturing process, the effect on the transistor TR and light emitting diode OLED becomes small or minimal.

Next, the second display area of a conventional display device will be described with reference to FIG. 9.

FIG. 9 is a cross-sectional view showing a second display area of a conventional display device.

Referring to FIG. 9, according to the conventional display device, the substrate SB includes a first layer 110*a* and a second layer 110*b* overlapping each other, and a barrier layer 1100 and an adhesive layer 110 disposed between the first layer 110*a* and the second layer 110*b*. The adhesive layer 110 may include silicon, and may enhance the adherence between the first layer 110*a* and the second layer 110*b* of the substrate SB.

A blocking layer 1200 is disposed on the substrate SB.

The buffer layer 1300, the first insulating layer 1400 to the fourth insulating layer 1700, the transistor TR, the capacitor, and the light emitting diode OLED are disposed on the blocking layer 1200 disposed on the substrate SB corresponding to the second pixel area PA2.

In the transparent area TA, the elements of the pixel circuit such as the transistor TR and the capacitor CP disposed in the second pixel area PA2 are not disposed, and the adhesive layer 110 disposed within the substrate SB and the blocking layer 1200, the buffer layer 1300, and the first insulating layer 1400 to the fourth insulating layer 1700 disposed on the substrate SB, are not disposed.

Thus, according to the conventional display device, in addition to a first removal process for removing the adhesive layer 110 of the substrate SB disposed on the transparent area TA, a second removal process for removing the blocking layer 1200 disposed on the substrate SB from the transparent area TA is used.

However, according to an embodiment of the display device according to the invention, as described above, the blocking layer 1200 is formed and the adhesive layer 110 is not formed within the substrate SB without forming the blocking layer 1200 on the substrate SB, such that only the blocking layer 1200 of the substrate SB disposed in the transparent area TA may be removed through a process similar to the conventional first removal process.

As such, according to an embodiment, the manufacturing process of the display device may be simplified as compared to the manufacturing process of the conventional display device.

Now, an experimental example according to an embodiment will be described.

Like the embodiment, in a first case (a case 1) forming the blocking layer between the first layer and the second layer of the substrate, a second case (a case 2) forming the adhesive layer including silicon between the first layer and the second layer of the substrate, and a third case (a case 3) without forming the blocking layer and the adhesive layer between the first layer and the second layer of the substrate, a peeling force between the first layer and the second layer is measured after respectively forming the substrate five times in a state in which conditions are the same. The greater the peeling force is, the greater the adhesion between the first layer and the second layer becomes, which means that two layers are difficult to peel from each other. In the first case, the blocking layer is formed of molybdenum with a thickness of about 50 Å, and in the second case, the adhesive layer is formed by depositing amorphous silicon ("a-Si") for about 5 seconds.

The results are shown in Table 1 below.

TABLE 1

| Remark | | Case 1 | Case 2 | Case 3 |
|---|---|---|---|---|
| Peeling force (gf/inch) | First time | 100.85 | 131.08 | 59.99 |
| | Second time | 97.41 | 118.66 | 67.92 |
| | Third time | 89.56 | 134.51 | 61.49 |
| | Fourth time | 105.31 | 114.44 | 79.26 |
| | Fifth time | 86.33 | 112.94 | 69.97 |
| | Average | 95.89 | 122.33 | 67.73 |

Referring to Table 1, in the first case (case 1) forming the blocking layer between the first layer and the second layer of the substrate as in the embodiments described herein, it may be confirmed that the adherence between the first layer and the second layer is high compared with the third case (case 3) and the difference of the adherence is not large compared with the second case (case 2), and it may be confirmed that the effective adherence is obtained between the first layer and the second layer to not be peeled between the first layer and the second layer of the substrate. In an embodiment, a peeling force between the first layer and the second layer of the substrate may be greater than about 90 gram-force per inch (gf/inch)

As described above, according to embodiments of the display device according to the invention, by removing the adhesive layer within the substrate and by forming the blocking layer and removing the blocking layer in the transparent area of the second display area, compared with the conventional display device in which the adhesive layer is formed within the substrate and the blocking layer is formed on the substrate, the manufacturing process is simplified while maintaining the adherence between the first layer and the second layer of the substrate, thereby reducing the manufacturing cost.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate comprising a first layer and a second layer;
a first display area including a first pixel area on the substrate;
a second display area including a second pixel area and a transparent area adjacent to each other on the substrate; and a blocking layer disposed in the second pixel area of the second display area, and disposed between the first layer and the second layer of the substrate in a side view,
wherein the blocking layer including a metal blocks light.

2. The display device of claim 1, wherein the substrate further includes:
a barrier layer disposed between the first layer and the second layer; and
wherein the first layer, the second layer and the barrier layer are disposed in the first display area and the second display area, and
the blocking layer is not disposed in the transparent area of the second display area.

3. The display device of claim 2, further comprising an optical device overlapping the second display area, and wherein the optical device is disposed under the second layer in a side view.

4. The display device of claim 3, wherein the blocking layer has a thickness of about 100 Å or less.

5. The display device of claim 2, wherein the second display area further includes a wiring area disposed at an edge of the transparent area, and the blocking layer is disposed in the wiring area.

6. The display device of claim 2, wherein the blocking layer is disposed between the barrier layer and the second layer.

7. The display device of claim 6, wherein the second layer is not disposed in the transparent area.

8. The display device of claim 2, wherein the blocking layer is disposed between the first layer and the barrier layer.

9. The display device of claim 2, wherein a pixel density of the second display area is smaller than a pixel density of the first display area.

10. The display device of claim 2, wherein each of the first pixel area and the second pixel area includes at least one pixel, and the at least one pixel includes an organic light emitting element.

11. The display device of claim 10, wherein the first pixel area and the second pixel area include a plurality of insulating layers disposed on the substrate, and the plurality of insulating layers is not disposed in the transparent area.

12. The display device of claim 1, wherein the blocking layer includes a metal.

13. The display device of claim 12, wherein the blocking layer has a thickness of about 100 Å or less.

14. The display device of claim 1, wherein the second display area further includes a wiring area disposed at an edge of the transparent area, and the blocking layer is disposed in the wiring area.

15. The display device of claim 1, wherein a pixel density of the second display area is smaller than a pixel density of the first display area.

16. The display device of claim 1, wherein each of the first pixel area and the second pixel area includes a pixel, and the pixel includes an organic light emitting element.

17. The display device of claim 16, wherein the first pixel area and the second pixel area include a plurality of insulating layers disposed on the substrate, and the plurality of insulating layers are not disposed in the transparent area.

18. A display device comprising:
a substrate including:
a first layer and a second layer overlapping each other; and
a blocking layer disposed between the first layer and the second layer,
wherein a first display area and a second display area are defined on the substrate;
a plurality of first pixel areas is defined on the substrate in the first display area,
a plurality of second pixel areas is defined on the substrate in the second display area,
a transparent area adjacent to the plurality of second pixel areas is defined on the substrate in the second display area,
wherein the blocking layer overlaps the plurality of second pixel areas, does not overlap the transparent area, and blocks light.

19. The display device of claim 18, wherein
a peeling force between the first layer and the second layer of the substrate is greater than about 90 gf/inch.

20. The display device of claim 18, wherein
the substrate further includes a barrier layer disposed between the first layer and the second layer, and
the blocking layer includes a metal.

\* \* \* \* \*